(12) United States Patent
Wang

(10) Patent No.: US 9,142,764 B1
(45) Date of Patent: Sep. 22, 2015

(54) METHODS OF FORMING EMBEDDED RESISTORS FOR RESISTIVE RANDOM ACCESS MEMORY CELLS

(71) Applicant: Intermolecular Inc., San Jose, CA (US)

(72) Inventor: Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/563,073

(22) Filed: Dec. 8, 2014

(51) Int. Cl.
*H01L 29/02* (2006.01)
*H01L 45/00* (2006.01)

(52) U.S. Cl.
CPC ............ *H01L 45/06* (2013.01); *H01L 45/1625* (2013.01)

(58) Field of Classification Search
CPC ..... H01L 45/146; H01L 45/145; H01L 45/16; H01L 45/1608; H01L 45/147; H01L 45/1616; H01L 45/165; H01L 45/1625; H01L 21/32055; H01L 27/11206; H01L 27/1159; H01L 27/2409; G11C 17/165
See application file for complete search history.

(56) References Cited

U.S. PATENT DOCUMENTS

| | | | | |
|---|---|---|---|---|
| 3,871,005 | A * | 3/1975 | Uchida et al. | 396/245 |
| 7,459,717 | B2 * | 12/2008 | Lung | 257/4 |
| 7,579,611 | B2 * | 8/2009 | Lam et al. | 257/2 |
| 8,552,413 | B2 * | 10/2013 | Tendulkar et al. | 257/4 |
| 8,822,966 | B2 * | 9/2014 | Takahashi et al. | 257/1 |
| 8,969,844 | B1 * | 3/2015 | Wang | 257/2 |
| 9,000,819 | B1 * | 4/2015 | Nardi et al. | 327/205 |
| 9,018,037 | B1 * | 4/2015 | Nardi et al. | 438/102 |
| 2010/0136313 | A1 * | 6/2010 | Shimizu et al. | 428/220 |
| 2012/0012807 | A1 * | 1/2012 | Yamaguchi et al. | 257/4 |
| 2014/0264231 | A1 * | 9/2014 | Wang et al. | 257/4 |

OTHER PUBLICATIONS

Nicolet, M., et al.; Ternary Amorphous Metallic Thin Films as Diffusion Barriers for Cu Metallization; Jan. 1, 1995; California Institute of Technology; Applied Surface Sciience pp. 269276.

* cited by examiner

*Primary Examiner* — Evan Pert
*Assistant Examiner* — Gustavo Ramallo

(57) ABSTRACT

Provided are memory cells including resistive switching layers having silicon, oxygen, and nitrogen as well as embedded resistor layers having a metal, silicon, and nitrogen. In some embodiments, silicon may be partially or completely replaced with aluminum. The embedded resistor may also have oxygen. A resistive switching layer directly interfaces an embedded resistor layer of the same cell. A portion of each layer forming this interface may be formed substantially of silicon nitride and may be formed in the same deposition chamber without breaking vacuum. For example, these portions may be formed by sequential atomic layer deposition cycles. However, silicon concentrations in these portions may be different. Specifically, the silicon concentration of the embedded resistor portion may be less than the silicon concentration of the resistive switching layer portion. This variation may be achieved by varying one or more process conditions during fabrication of the memory cell.

20 Claims, 7 Drawing Sheets

Initial Forming

Operational Switching

METHODS OF FORMING EMBEDDED RESISTORS FOR RESISTIVE RANDOM ACCESS MEMORY CELLS

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are memory cells including resistive switching layers having silicon, oxygen, and nitrogen as well as embedded resistor layers having a metal, silicon, and nitrogen. In some embodiments, silicon may be partially or completely replaced with aluminum. The embedded resistor may also have oxygen. A resistive switching layer directly interfaces an embedded resistor layer of the same cell. A portion of each layer forming this interface may be formed substantially of silicon nitride and may be formed in the same deposition chamber without breaking vacuum. For example, these portions may be formed by sequential atomic layer deposition cycles. However, silicon concentrations in these portions may be different. Specifically, the silicon concentration of the embedded resistor portion may be less than the silicon concentration of the resistive switching layer portion. This variation may be achieved by varying one or more process conditions during fabrication of the memory cell.

In some embodiments, a method of fabricating a memory cell involves forming a first layer over a substrate and then forming a second layer directly interfacing the first layer. The first layer is operable to reversibly switch between two resistive states in response to applying a switching signal to the memory cell. The first layer includes silicon, oxygen, and nitrogen. In some embodiments, silicon may be partially or completely replaced with aluminum in the first layer. For example, the first layer may include silicon oxynitride and/or aluminum oxynitride. The second layer is operable to maintain a constant resistance when the switching signal is applied to the memory cell. The second layer includes a metal, silicon, and nitrogen. In some embodiments, silicon may be partially or completely replaced with aluminum in the first layer. The concentration of silicon and/or aluminum in the second layer may be less than the concentration of silicon and/or aluminum in the first layer. In some embodiments, a portion of the second layer interfacing the first layer consists essentially of silicon and nitrogen.

In some embodiments, the first layer and the second layer are formed using atomic layer deposition in the same chamber. The first layer and the second layer may be formed without removing the substrate from the chamber. Furthermore, the first layer and the second layer may be formed without breaking vacuum in the chamber.

In some embodiments, forming the second layer involves forming a silicon nitride sub-layer (or an aluminum nitride sub-layer) and forming a metal nitride sub-layer. The silicon nitride sub-layer (or the aluminum nitride sub-layer) of the second layer may directly interface the first layer. The concentration of silicon (or aluminum) in the silicon nitride sub-layer (or the aluminum nitride sub-layer) of the second layer may be less than a concentration of silicon (or aluminum) in the first layer. While the remaining description is referred to use of silicon in the first layer and the second layer, one having ordinary skills in the art would understand that silicon may be fully or partially replaced with silicon. For brevity, descriptions of examples using aluminum by itself or in a combination with silicon are mostly omitted. Furthermore, when a reference is made to a metal in making or final composition of the second layer, this metal is different from aluminum and included in addition to aluminum.

In some embodiments, the first layer also includes a silicon nitride sub-layer. The silicon nitride sub-layer of the second layer directly interfaces the silicon nitride sub-layer of the first layer. Furthermore, the silicon nitride sub-layer of the second layer and the silicon nitride sub-layer of the first layer may be formed using consecutive atomic layer deposition cycles in a same chamber. However, the silicon nitride sub-layer of the second layer and the silicon nitride sub-layer of the first layer are formed using different process parameters.

In some embodiments, the method also involves annealing at least the second layer to uniformly distribute the metal, silicon, and nitrogen in the second layer. The thickness of the second layer may be between about 20 Angstroms and 100 Angstroms. The thickness of the first layer may be between about 10 Angstroms and 30 Angstroms. The metal of the second layer may be one of tantalum, titanium, hafnium, and tungsten.

In some embodiments, forming the first layer involves flowing a silicon containing precursor and/or aluminum containing precursor into a chamber. The silicon containing precursor and/or aluminum containing precursor is adsorbed on a surface of the substrate. The forming operation then proceeds with flowing a nitrogen containing reactive gas (e.g., ammonia $NH_3$). The nitrogen containing reactive gas is reacted with the silicon containing precursor and/or aluminum containing precursor adsorbed on the surface of the substrate. The forming operation further comprises flowing an oxygen containing reactive gas into the chamber. The oxygen containing reactive gas is reacted with the silicon containing precursor and/or aluminum containing precursor adsorbed on the surface of the substrate. The oxygen containing reactive gas is flowed into the chamber after the nitrogen containing reactive gas.

In some embodiments, the method also involves forming a third layer operable as an oxygen vacancy source. The third layer may include an oxide. The third layer directly interfaces the first layer. In some embodiments, the oxide of the third layer is hafnium oxide. A portion of the first layer interfacing the third layer consists essentially of silicon and nitrogen, consists essentially of aluminum and nitrogen, or consists essentially of aluminum, silicon, and nitrogen.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings.

FIG. 4A illustrates a detailed representation of the embedded resistor and resistive switching layer, in accordance with some embodiments.

DETAILED DESCRIPTION

Figure 1A:
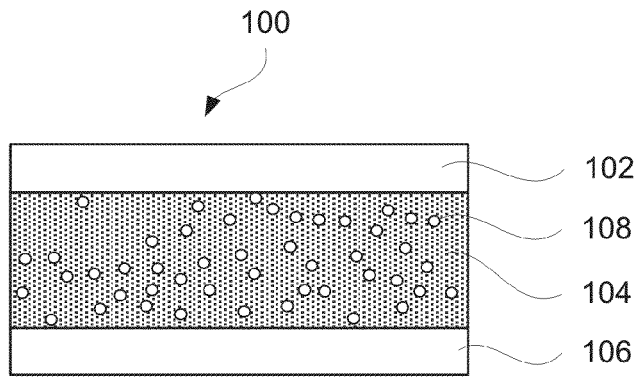
FIG. 1A illustrates a schematic representation of a ReRAM cell prior to initial forming operation, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

INTRODUCTION

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. The stack also includes an insulator layer provided in between the two electrodes and identified as "I". The insulator layer changes its resistive properties when certain switching voltages are applied to the layer or, more generally, to the ReRAM cell including this layer. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

The switching voltages may be applied as series of pulses and may be generally referred to as switching voltage profiles or, more specifically, set voltage profiles and reset voltage profiles. For example, a switching voltage pulse may be used to change ("set" or "reset") the resistive state followed by a smaller reading voltage pulse to determine the current state of the ReRAM cell at that time. Unlike the switching voltage pulse, the reading pulse is specifically configured to avoid changing the resistive state of the ReRAM cell and is configured only to determine the current state. The switching pulse may be repeated if the desired resistive state is not reached. The switching pulses may alternate with the reading pulses for feedback control. The switching pulses may vary from one to another based on their potential (e.g., a gradual increase in the potential), duration, and other characteristics. The reading pulses may be the same. The process of applying the switching pulses and reading pulses may continue until the desired resistive state is reached.

The change in resistance of the resistive switching layer is a dynamic process that needs to be well controlled to prevent over-programming. For example, when the resistive switching layer is switched from its high resistive state (HRS) to its low resistive state (LRS), a rapid drop in resistance associated with this switch may cause an excessive current through the resistive switching layer and an over-programming. The over-programming occurs when change in the resistance continues even after the resistive switching layer reaches its desirable resistance. One approach to prevent over-programming is by using very short pulses, e.g., about 50 nanoseconds, followed by a reading pulse. If the desired resistive state is not reached, another pulse is applied. The process of applying switching and reading pulses may be repeated until the desired resistance is not reached. However, shorter pulses have their own inherent limitations, such as requiring more pulses or higher voltages to achieve the same switching result, which may consume more power than fewer, longer, lower-voltage pulses. Furthermore, even during a relatively short switching pulse, the change in resistance may be sufficiently large to result in current spiking and over-programming. In some embodiments, the difference in resistances between the LRS and the HRS may be more than an order of magnitude to allow the read pulses to easily differentiate between the two states.

To prevent current spiking and over-programming, an embedded resistor is connected in series with the resistive switching layer and is used to limit the current through the resistive switching layer. Specifically, an embedded resistor is a layer operable to maintain a constant resistance when the switching signal is applied to the ReRAM cell. The embedded resistor effectively functions as a voltage divider within the ReRAM cell. Unlike the resistive switching layer, the embedded resistor maintains a constant resistance throughout the entire operation of the cell. As a relative change of the overall ReRAM cell resistance (expressed as a ratio of the change in the resistance of the ReRAM cell to the overall initial resistance) when the resistive switching layer goes between the LRS and the HRS is less for ReRAM cells with embedded resistors than for similar cells without embedded resistor. This voltage divider/constant resistance characteristic of the embedded resistor helps to prevent the current spiking and over-programming.

Various components and features can be used in a ReRAM cell to reduce its operating power and, in some embodiments, its forming power. One example of these components and features includes an inert electrode. The inert electrode may be configured to have minimal, if any, materials exchange with a resistive switching layer. As such, the inert electrode forms an interface that may remain substantially the same during operational switching.

Another example of these components and features includes a material having a low dielectric constant that is used in a resistive switching layer. This material may have covalent bond material. Some examples of suitable materials include silicon oxide, silicon oxynitride, silicon nitride, aluminum silicon oxide, aluminum silicon oxynitride, aluminum silicon nitride, aluminum oxide, aluminum oxynitride, and aluminum nitride.

Another component may be formed from a high k dielectric material that is operable as an oxygen vacancy source during forming and operational switching of the resistive switching layer. Unlike the inert electrode, this component participates in an active exchange of materials (e.g., oxygen, elements that are bound to oxygen) with the resistive switching layer through an interface formed by the high k dielectric component and resistive switching layer. Without being restricted to any particular theory, it is believed that the resistive switching actually occurs at this interface as further described below with reference to FIGS. 1B and 1C. Specifically, the high k dielectric component and the inert electrode may both directly interface the resistive switching layer in the ReRAM cell, but only one of these two interfaces is responsible for the resistive switching. The high k dielectric may have an ionic bonding rather covalent bonding. One examples of a suitable high k dielectric material includes hafnium oxide.

Yet another component, which may be used to lower the operating power of a ReRAM cell, is a source electrode. This electrode may be used to provide oxygen vacancies and/or extract these vacancies from, for example, a high k dielectric component. As such, the source electrode may directly interface with the high k dielectric component. In one example, the high k dielectric component may be disposed between the source electrode and the low k dielectric component and directly interface both the source electrode and the low k dielectric component. A source electrode may be made from titanium nitride, as an example.

An embedded resistor may also be used to lower the operating power of a ReRAM cell. A more direct function of the embedded resistor is to prevent over-programming. In some embodiments, the embedded resistor may have a thickness of between 20 Angstroms and 100 Angstroms and may be disposed between the electrodes of a ReRAM cell in order to reduce the overall stack thickness. The resistivity of the embedded resistor may be between about 0.1 Ohm-cm and 10 Ohm-cm or, more specifically, between about 1 Ohm-cm and 4 Ohm-cm. Furthermore, the embedded resistor may be designed to withstand up to 750° C. for at least 1 minute without a significant loss in its resistivity or compromising other components in the stack, in particular, the components directly interfacing the embedded resistor (due to material diffusion). The embedded resistor may have a constant resistance with an operating voltage (e.g., a forming signal and operating signal) is applied to the ReRAM cell and to the embedded resistor. These signals may be repeatedly applied to the embedded resistor over the operating lifetime of the ReRAM cell, which may be millions of cycles, and the embedded resistor needs to withstand these conditions without electrical breakdown.

Provided are stacks for use in ReRAM cells such that each stack includes a resistive switching layer and embedded resistor directly interfacing the resistive switching layer. Both the resistive switching layer and embedded resistor include silicon (and/or aluminum) and nitrogen. The resistive switching layer may also include oxygen, while the embedded resistor may also include a metal, such as tantalum, titanium, hafnium, or tungsten. Because both the resistive switching layer and embedded resistor include silicon (and/or aluminum) and nitrogen, a process of forming such a stack is simpler than, for example, when both components are formed from completely dissimilar materials, e.g., when only one common element is present in both components or no common elements are present at all. For example, the same processing equipment may be used to form both components and, more specifically, the same processing equipment may be used to form both components without breaking vacuum thereby eliminating undesirable oxidation at the interface. In some embodiments, a ReRAM cell may include a titanium nitride electrode, a hafnium oxide oxygen vacancy source, silicon oxynitride resistive switching layer, and a metal silicon nitride embedded resistor. A stack including such a resistive switching layer and embedded resistor may be deposited using atomic layer deposition in the same deposition chamber. For example, a base process may involve alternating pulses of a silicon containing precursor (e.g., tris(dimethylamino) silane (3DMAS), silanediamine, N,N,N',N'-tetratethyl(SAM 24), trisilylamine (TSA), and the like) and nitrogen containing reactive gas (e.g., ammonia). In another example, silicon in the resistive switching layer and/or embedded resistor may be partially or completely replaced with aluminum. In this case, the process may involve alternating pulses of an aluminum containing precursor (e.g., aluminum tris(2,2,6,6-tetramethyl-3,5-heptanedionate) $(Al(OCC(CH_3)_3CHCOC(CH_3)_3)_3)$, triisobutylaluminum $([(CH_3)_2CHCH_2]_3Al)$, trimethylaluminum $(CH_3)_3Al)$, tris(dimethylamido)aluminum $(Al(N(CH_3)_2)_3)$ and nitrogen containing reactive gas (e.g., ammonia). Furthermore, an aluminum containing precursor and silicon containing precursor may be both introduced into the chamber prior to flowing a nitrogen containing reactive gas. The deposition may be performed at about 275° C. to 400° C. and, in come embodiments, plasma may be used (i.e., plasma-enhanced ALD) to control density, deposition rate, and other characteristics of deposited layers.

To form a resistive switching layer, the base process may be modified by adding a pulse of an oxygen containing reactive gas (e.g., ozone, water, molecular oxygen) into the deposition chamber. The oxygen containing reactive gas may be pulsed before or after the nitrogen containing reactive gas. The pulsing order may depend on the desired composition of the resistive switching layer, reactivity of the oxygen containing reactive gas and h, duration of each pulse, and other factors. In some embodiments, a single pulse of the silicon containing precursor (and/or aluminum containing precursor) is followed by a pulse of the oxygen containing reactive gas and a pulse of the nitrogen containing reactive gas before repeating the pulse of the silicon containing precursor (and/or aluminum containing precursor). Alternatively, a single pulse of the silicon containing precursor (and/or aluminum containing precursor) is followed by a pulse of the oxygen containing reactive gas or a pulse of the nitrogen containing reactive gas, but not both, before repeating the pulse of the silicon containing precursor (and/or aluminum containing precursor). A pair containing one silicon containing precursor pulse and one nitrogen containing pulse may be alternating with a pair containing one silicon containing precursor pulse and one oxygen containing pulse. In some embodiments, multiple pairs each containing one silicon containing precursor pulse and one nitrogen containing pulse may be followed by a single pair one silicon containing precursor pulse and one oxygen containing pulse after which the process continues with multiple pairs each containing one silicon containing precursor pulse and one nitrogen containing pulse. Furthermore, multiple pairs each containing one silicon containing precursor pulse and one oxygen containing pulse may be followed by a single pair containing one silicon containing precursor pulse and one nitrogen containing pulse after which the process continues with multiple pairs each containing one silicon containing precursor pulse and one oxygen containing pulse. Also, multiple pairs each containing one silicon containing precursor pulse and one oxygen containing pulse may alternate with multiple pairs each containing one silicon containing precursor pulse and one nitrogen containing pulse. In some embodiments, a silicon containing precursor pulse may be combined with a pulse that uses a mixture of a nitrogen containing reactive gas and an oxygen containing reactive gas.

To form an embedded resistor, the base process may be modified by replacing one or more silicon containing precursor (and/or aluminum containing precursor) pulses with one or more metal containing precursor pulses. For example, in one pulse a silicon containing precursor (and/or aluminum containing precursor) may be replaced with a precursor containing a transition metal, such as tertiarybutylimido, tris (diethylamino) tantalum (TBTDET) or pentakis(dimethylamino) tantalum (PDMAT).

Overall, a resistive switching layer may be initially formed as a nanolaminate of silicon nitride and silicon oxide layers, while an embedded resistor may be initially formed as a nanolaminate of silicon nitride and metal nitride layers. In some embodiments, some or all silicon in one or both of these components may be replaced with aluminum. The distribution of materials in the overall stack may be impacted by annealing but concentration gradients may still remain.

Similar approaches can be used with other deposition techniques, such as physical vapor deposition. For example, a silicon containing target (and/or an aluminum containing target) and metal containing target may be used in the same chamber. Sputtering of these targets may be varied. For example, the metal containing target may not be sputtered when forming a resistive switching layer, while both targets may be used while forming an embedded resistor. The environment of the chamber may include an oxygen containing gas and/or nitrogen containing gas to support reactive sputtering. The concentrations of the oxygen containing gas and nitrogen containing gas may change to vary the amount of oxygen and nitrogen in the deposited layer. For example, substantially no oxygen containing gas may be present in the deposition chamber when forming the embedded resistor.

Examples of Nonvolatile ReRAM Cells and their Switching Mechanisms

A brief description of ReRAM cells is provided for context and better understanding of various features associated with embedded resistors in the ReRAM cells. As stated above, a ReRAM cell includes a dielectric material formed into a layer exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

FIG. 1A illustrates a schematic representation of ReRAM cell 100 including first electrode 102, second electrode 106, and resistive switching layer 104 disposed in between first electrode 102 and second electrode 106. It should be noted that the "first" and "second" references for electrodes 102 and 106 are used solely for differentiation and not to imply any processing order or particular spatial orientation of these electrodes. ReRAM cell 100 may also include other components, such as an embedded resistor, diode, diffusion barrier layer, and other components. ReRAM cell 100 is sometimes referred to as a memory element or a memory unit.

First electrode 102 and second electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface).

Resistive switching layer 104 which may be initially formed from a dielectric material and later can be made to conduct through one or more conductive paths formed within the layer by applying first a forming voltage and then a switching voltage. To provide this resistive switching functionality, resistive switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within first electrode 102 and may be later transferred to resistive switching layer 104 during the formation operation. In some embodiments, the resistive switching layer 104 has substantially no defects prior to forming operation and all defects are provided from first electrode 102 during forming. Second electrode 106 may or may not have any defects. It should be noted that regardless of presence or absence of defects in second electrode 106, substantially no defects are exchanged between second electrode 106 and resistive switching layer 104 during forming and/or switching operations.

Figure 1B:
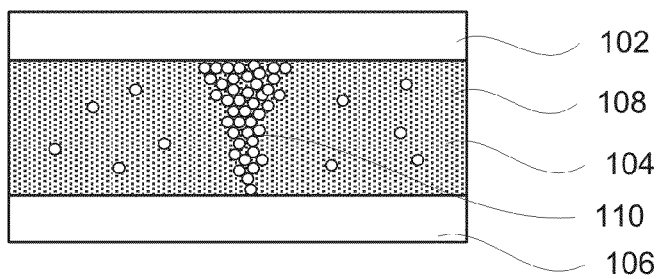
FIGS. 1B and 1C illustrate schematic representations of the ReRAM cell in its high resistive state (HRS) and low resistive state (LRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistive switching layer 104 to form these conductive paths as, for example, schematically shown in FIG. 1B. Furthermore, some or all defects 108 forming the conductive paths may enter resistive switching layer 104 from first electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell 100. The forming operation involves applying forming signals to ReRAM cell 100.

Figure 1C:
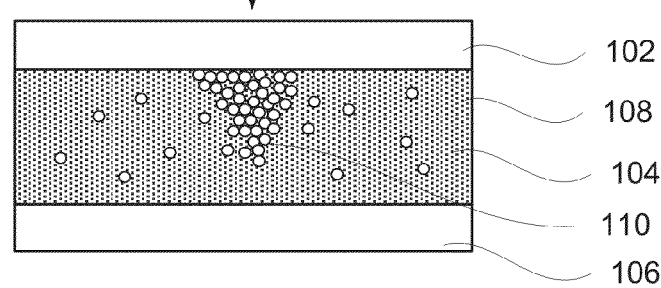

Resistive switching involves breaking and reforming conductive paths through resistive switching layer 104, i.e., switching between the state schematically illustrated in FIG. 1B and the state schematically illustrated in FIG. 1C, when switching signals are applied to ReRAM cell 100. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into first electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and first electrode 102, the conductive paths may break closer to the interface with second electrode 106, somewhere within resistive switching layer 104, or at the interface with first electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from first electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 106 during the set operation has the same polarity as a voltage applied during the reset operation. This type of switching is referred to as unipolar switching. Alternatively, a voltage applied to electrodes 102 and 106 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
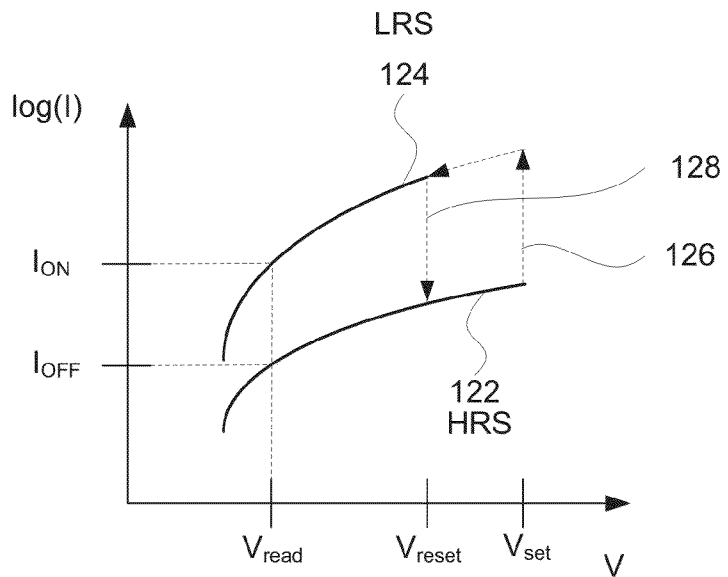
FIG. 2A illustrates a plot of a current passing through a unipolar ReRAM cell as a function of a voltage applied to the ReRAM cell, in accordance with some embodiments.
Figure 2B:
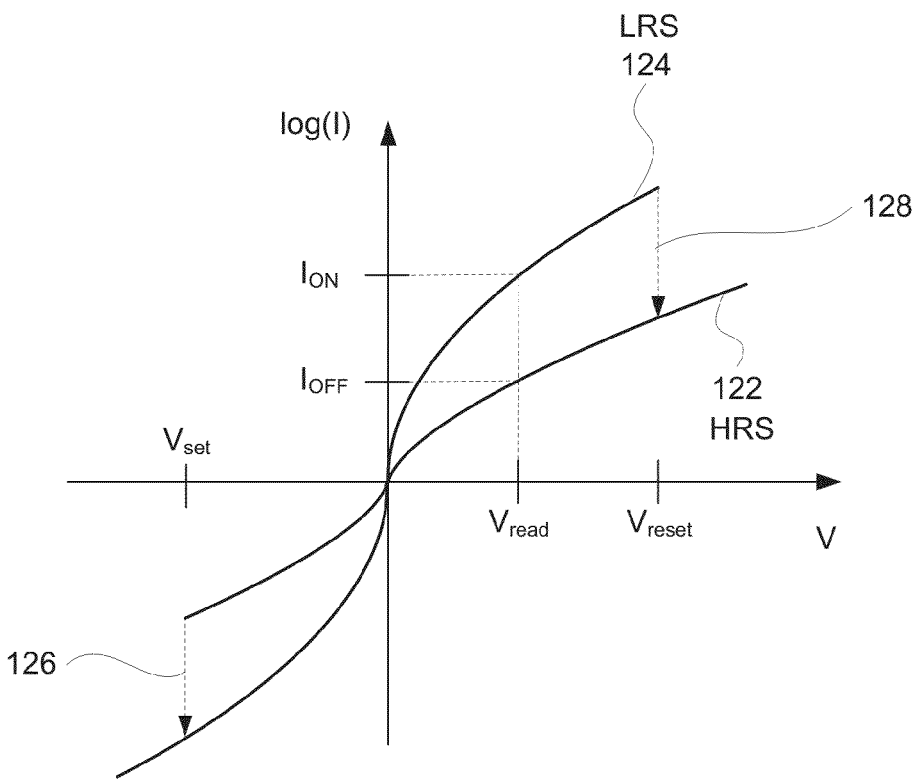
FIG. 2B illustrates a plot of a current passing through a bipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistive switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistive switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistive switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

Processing Examples

Figure 3A:
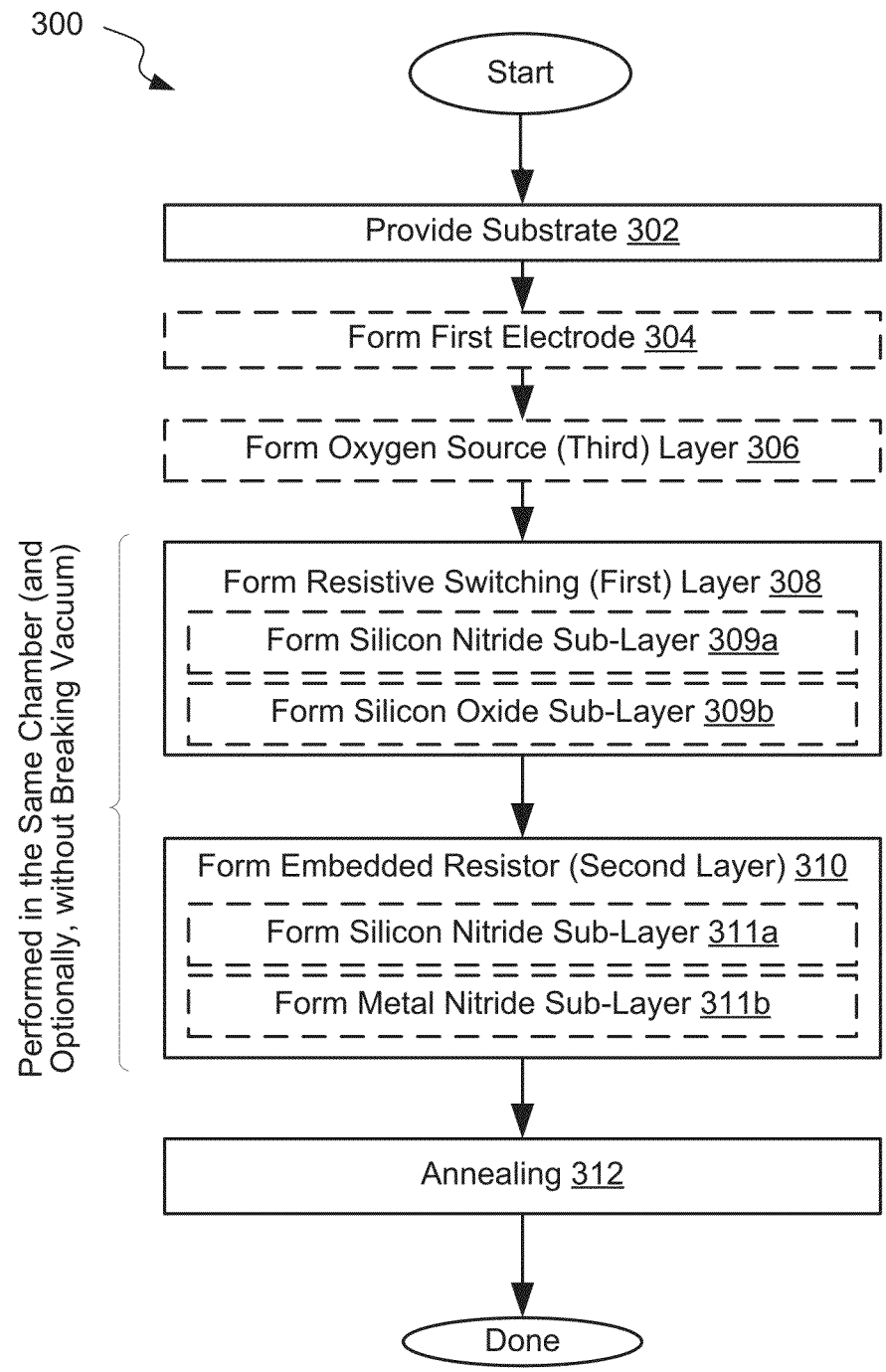
FIG. 3A illustrates a process flowchart corresponding to a method of fabricating a ReRAM cell including an embedded resistor, in accordance with some embodiments.

FIG. 3A illustrates a process flowchart corresponding to method 300 of fabricating a ReRAM cell, in accordance with some embodiments. Method 300 may commence with providing a substrate during operation 302. The substrate may include one or more components, such as a first signal line, a first electrode, an oxygen source layer, a current steering element, and/or other components. If one or more of these components is present on the substrate during operation 302, then method 300 may not include operations that form these components. For example, FIG. 3A illustrates operations 304 and 306 as optional operations that may or may not be performed.

In some embodiments, method 300 involves forming a first electrode during operation 304. The first electrode can be formed from silicon (e.g., doped polysilicon), silicide, titanium nitride, or other conductive materials. For example, a titanium nitride layer may be formed using physical vapor deposition or other suitable deposition techniques. Specifically, a titanium target may be sputtered in a nitrogen-containing atmosphere (e.g., molecular nitrogen, ammonia) maintained at a pressure of between about 1-20 mTorr. Other processing techniques, such as ALD, PLD, CVD, evaporation, and the like can also be used to deposit the first signal line.

Method 300 may proceed with forming an oxygen source layer during operation 306. The oxygen source layer may also referred to as a third layer to distinguish it from a resistive switching layer, which may be referred to as a first layer, and from an embedded resistor, which may be referred to as a second layer. "First," "second," and "third" are used herein for differentiating purposes only and do not represent an order of forming these layers or orientation of these layers with respect to each other, unless specifically noted. The oxygen source layer may be formed from a dielectric having a high dielectric constant, such as greater than about 15 or, more specifically, at least about 20. Some examples of suitable materials include hafnium oxide, zirconium oxide, titanium oxide, tantalum oxide, and strontium titanium oxide (STO).

Method 300 may proceed with forming a resistive switching layer during operation 308. As stated above, the resistive switching layer may be referred to as a first layer. In some embodiments, the resistive switching layer is formed directly on the surface of the oxygen source layer. Alternatively, the resistive switching layer is formed directly on the surface of the embedded resistor. The resistive switching layer may be formed from a dielectric having a low dielectric constant, such as less than about 15 or, more specifically, less than about 20. The resistive switching layer may be operable to reversibly switch between two resistive states in response to applying a switching signal to the ReRAM cell. The resistive switching layer may include silicon, oxygen, and nitrogen. In some embodiments, silicon, oxygen, and nitrogen form silicon oxynitride in the resistive switching layer. Additional examples of suitable materials include aluminum oxide, aluminum oxynitride, and aluminum nitride.

Operation 308 may involve forming one or more silicon nitride sub-layers (and/or aluminum nitride sub-layers) such that each such sub-layer is formed in a separate operation 309a, and forming one or more silicon oxide sub-layers (and/or aluminum oxide sub-layers) such that each such sub-layer is formed in a separate operation 309b). The number of times operations 309a and 309b are performed depends on the overall thickness of the resistive switching layer, composition of the resistive switching layer, and other characteristics. Specifically, after completing operation 308, the resistive switching layer may be a nanolaminate of silicon nitride sub-layers and silicon oxide sub-layers. In some embodiments, silicon nitride sub-layers and silicon oxide sub-layers may be replaced completely or partially with aluminum nitride sub-layers and aluminum oxide sub-layers, respectively. The distribution of these sub-layers within the resistive switching layer is further described below with reference to FIG. 4B. Operations 309a and 309b may alternate such that a group of one or more operations 309a may follow by a group of one or more operations 309b.

Operation 308 may involve atomic layer deposition, physical vapor deposition, or any other suitable deposition method. When atomic layer deposition is used, operation 309a may represent a cycle of pulsing a silicon containing precursor (and/or aluminum containing precursor) into a deposition chamber followed by pulsing a nitrogen containing reactive gas that reacts with the silicon containing precursor (and/or aluminum containing precursor) adsorbed on the surface of the substrate thereby forming a silicon nitride sub-layer (and/or aluminum nitride sub-layer). Operation 309b may represent a cycle of pulsing a silicon containing precursor (and/or aluminum containing precursor) into a deposition chamber followed by pulsing an oxygen containing reactive gas that reacts with the silicon containing precursor (and/or aluminum containing precursor) adsorbed on the surface of the substrate thereby forming a silicon oxide sub-layer (and/or an aluminum oxide sub-layer). Examples of various precursors are further described below.

Figure 3B:
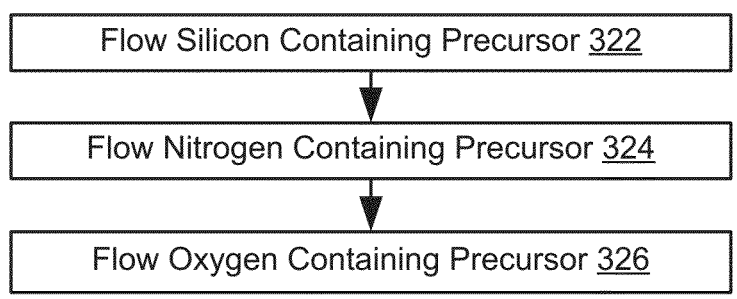
FIG. 3B is a breakdown of an operation used to form a resistive switching layer, in accordance with some embodiments.

Alternatively, operation 308 may not involve separate operations 309a and 309b. Instead, a silicon oxynitride sub-layer (and/or an aluminum oxynitride sub-layer) is formed on a substrate in the same atomic layer deposition cycle, which involves flowing a silicon containing precursor (and/or aluminum containing precursor) into a deposition chamber followed by flowing a nitrogen containing reactive gas and an oxygen containing reactive gas before repeating the cycle as, for example, shown in FIG. 3B. The nitrogen containing reactive gas may be flowed before, after, or together with the oxygen containing reactive gas. As shown in FIG. 3B, operation 308 may involve flowing a silicon containing precursor (and/or aluminum containing precursor) into the chamber (block 322). The silicon containing precursor (and/or aluminum containing precursor) is adsorbed on the surface of the substrate. Operation 308 may proceed with flowing a nitrogen containing reactive gas into the chamber (block 324). The nitrogen containing reactive gas reacts with the silicon containing precursor (and/or aluminum containing precursor) adsorbed on the surface of the substrate. Operation 308 may then proceed with flowing an oxygen containing reactive gas into the chamber (block 326). The oxygen containing reactive gas reacts with the silicon containing precursor (and/or aluminum containing precursor) adsorbed on the surface of the substrate, which has not previously reacted with the nitrogen containing reactive gas. Because for many precursors, silicon oxide (and/or aluminum oxide) is more readily formed that silicon nitride (and/or aluminum nitride), the nitrogen containing reactive gas may be introduced into the chamber before the oxygen containing reactive gas.

Method 300 may proceed with forming an embedded resistor during operation 310. As stated above, the embedded resistor may be referred to as a second layer. In some embodiments, the embedded resistor is formed directly on the surface of the resistive switching layer. Alternatively, the embedded resistor is formed directly on the surface of another component, such as a second electrode. The embedded resistor may directly interface with the resistive switching layer as further described below with reference to FIGS. 4A and 4B. The embedded resistor may include a metal, silicon, and nitrogen. In some embodiments, most or all silicon of the embedded resistor may be replaced with aluminum. The embedded resistor is operable to maintain a constant resistance when the switching signal is applied to the ReRAM cell.

Operation 310 may involve forming one or more silicon nitride sub-layers (and/or one or more aluminum nitride sub-layers) such that each such sub-layer is formed in a separate operation 311a, and forming one or more metal nitride sub-layers such that each such sub-layer is formed in a separate operation 311b). The number of times operations 311a and 311b are performed depends on the overall thickness of the embedded resistor, composition of the embedded resistor, and other characteristics. Specifically, after completing operation 310, the embedded resistor may be a nanolaminate of silicon nitride sub-layers (and/or aluminum nitride sub-layers) and metal nitride sub-layers. The distribution of these sub-layers within the embedded resistor is further described below with reference to FIG. 4B. Operations 311a and 311b may alternate such that a group of one or more operations 311a may follow by a group of one or more operations 311b. In some embodiments, one of operations 311a is performed after operation 309a without any intervening operations 311b and 309b. In other words, a silicon nitride sub-layer of the resistive switching layer directly interfaces a silicon nitride sub-layer of the embedded resistor. However, these two silicon nitride sub-layers may be formed using different processing conditions and/or have different composition as further described below with reference to FIG. 4B. Alternatively, an aluminum nitride sub-layer of the resistive switching layer directly interfaces an aluminum nitride sub-layer of the embedded resistor. However, these two aluminum nitride sub-layers may be formed using different processing conditions and/or have different composition as further described below with reference to FIG. 4B.

Operation 310 may involve atomic layer deposition, physical vapor deposition, or any other suitable deposition method. When atomic layer deposition is used, operation 311a may represent a cycle of pulsing a silicon containing precursor (and/or aluminum containing precursor) into a deposition chamber followed by pulsing a nitrogen containing reactive gas that reacts with the silicon containing precursor (and/or aluminum containing precursor) adsorbed on the surface of the substrate thereby forming a silicon nitride sub-layer (and/or aluminum nitride sub-layer). Operation 311b may represent a cycle of pulsing a metal containing precursor into a deposition chamber followed by pulsing a nitrogen containing reactive gas that reacts with the silicon containing precursor adsorbed on the surface of the substrate thereby forming a metal nitride sub-layer. Examples of various precursors are further described below.

Figure 3C:
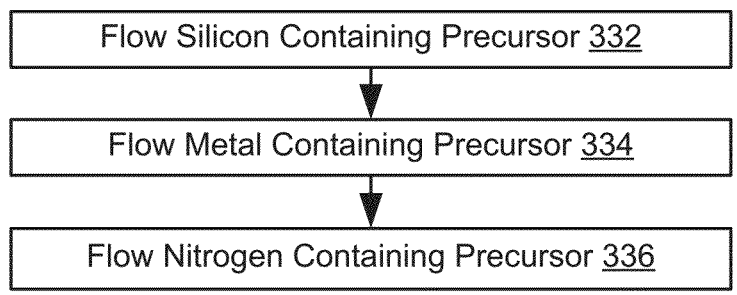
FIG. 3C is a breakdown of an operation used to form an embedded resistor, in accordance with some embodiments.

Alternatively, operation 310 may not involve separate operations 311a and 311b. Instead, a metal silicon nitride sub-layer is formed on a substrate in the same atomic layer deposition cycle, which involves flowing a silicon containing precursor and a metal containing precursor into a deposition chamber followed by flowing a nitrogen containing reactive gas before repeating the cycle as, for example, shown in FIG. 3C. The metal containing precursor may be flown before, after, or together with the silicon containing precursor. As shown in FIG. 3C, operation 310 may involve flowing a silicon containing precursor into the chamber (block 332). The silicon containing precursor is adsorbed on the surface of the substrate. Operation 310 may proceed with flowing a metal containing precursor into the chamber (block 334). The metal containing precursor may also adsorb on the surface of the substrate. The operating temperature may below the temperature that would causes these two precursors to react with each other and, for example, form a metal silicide. In some embodiments, the temperature used for operation 310 is less than 400° C. or even less than 300° C. Operation 310 may then proceed with flowing a nitrogen containing reactive gas into the chamber (block 336). The nitrogen containing reactive gas reacts with the silicon containing precursor and metal containing precursor adsorbed on the surface of the substrate. Usually, a metal containing precursor is flown first followed by a silicon containing precursor because most silicon containing precursors react slowly with reactive gases (e.g., ammonia). As such, covering the metal containing precursor with the silicon containing precursor may help achieving more consistent reaction kinetics.

In some embodiments, both operations 308 and 310 are performed using atomic layer deposition process. Each ALD cycle involves the following four steps: introducing a first precursor into a chamber to form an adsorbed layer, purging a portion of the precursor that was not adsorbed, introducing a second precursor into the chamber (the second precursor may be also referred to as a reactive agent) to react with the adsorbed layer of the first precursor. As described above, this ALD cycle may be modified by introducing an additional precursor that may react with the first precursor or the second precursor. Selection of precursors, reactive agents, processing conditions (e.g., duration of each step, temperatures, concentrations of different materials, and the like) depend on the desired composition, morphology, and structure of each sub-layer in the resistive switching layer and the embedded resistor. A sub-layer formed during each ALD cycle may have a thickness of between about 0.25 Angstroms and about 2 Angstroms, averaged over the deposition area. The cycle may be repeated multiple times until the stack reaches its desired thickness. As described above, ALD cycles may be repeated using different precursors.

Examples of silicon containing precursors include (3-Aminopropyl)triethoxysilane ($H_2N(CH_2)_3Si(OC_2H_5)_3$), n-sec-Butyl(trimethylsilyl)amine($C_7H_{19}NSi$), chloropentamethyldisilane (($CH_3)_3SiSi(CH_3)_2Cl$), 1,2-dichlorotetramethyldisilane ($[ClSi(CH_3)_2]_2$), 1,3-diethyl-1,1,3,3-tetramethyldisilazane ($C_8H_{23}NSi_2$), 1,2-dimethyl-1,1,2,2-tetraphenyldisilane (($SiCH_3(C_6H_5)_2)_2$), dodecamethylcyclohexasilane (($Si(CH_3)_2)_6$), hexamethyldisilane (($Si(CH_3)_3)_2$), hexamethyldisilazane, $(CH_3)_3SiNHSi(CH_3)_3$, methylsilane ($CH_3SiH_3$), 2,4,6,8,10-pentamethylcyclopentasiloxane (($CH_3SiHO)_5$), pentamethyldisilane (($CH_3)_3SiSi(CH_3)_2H$), silicon tetrabromide ($SiBr_4$), silicon tetrachloride ($SiCl_4$), tetraethylsilane ($Si(C_2H_5)_4$), 2,4,6,8-tetramethylcyclotetrasiloxane (($HSiCH_3O)_4$), 1,1,2,2-Tetramethyldisilane (($CH_3)_2SiHSiH(CH_3)_2$), tetramethylsilane ($Si(CH_3)_4$), n,n',n"-tri-tert-butylsilanetriamine(HSi(HNC($CH_3)_3)3$), tris(tert-butoxy)silanol ((($CH3)3CO)3SiOH$), and tris(tert-pentoxy)silanol (($CH_3CH_2C(CH_3)_2O)_3SiOH$).

A metal containing precursor may include one of tantalum, titanium, hafnium, or tungsten and, therefore, may be referred to as a tantalum containing precursor, tantalum containing precursor, titanium containing precursor, hafnium containing precursor, or tungsten containing precursor, respectively. Examples of tantalum containing precursors include pentakis (dimethylamino) tantalum ($Ta(N(CH_3)_2)_5$), tris(diethylamido)(tert-butylimido)tantalum (($CH_3)_3CNTa(N(C_2H_5)_2)_3$), tris(diethylamido)(ethylimido) tantalum ($C_2H_5NTa(N(C_2H_5)_2)_3$), tris(ethylmethylamido) (tert-butylimido) tantalum ($C_{13}H_{33}N_4Ta$).\

Some examples of titanium containing precursors include titanium chloride ($TiCl_4$), titanium iodine ($TiI_4$), bis(tert-butylcyclopentadienyl) titanium dichloride ($C_{18}H_{26}Cl_2Ti$), bis (diethylamido)bis(dimethylamido)titanium ($Ti(N(CH_3)_2)_2(N(CH_2CH_3)_2)_2$), tetrakis(diethylamido)titanium ($[(C_2H_5)_2N]_4Ti$), tetrakis(dimethylamido)titanium ($[(CH_3)_2N]_4Ti$), tetrakis(ethylmethylamido)titanium ($[(CH_3C_2H_5)N]_4Ti$), titanium diisopropoxidebis(2,2,6,6-tetramethyl-3,5-heptanedionate) ($Ti[OCC(CH_3)_3CHCOC(CH_3)_3]_2(OC_3H_7)_2$), and titanium isopropoxide ($Ti[OCH(CH_3)_2]_4$).

Examples of hafnium containing precursors include bis (tert-butylcyclopentadienyl)dimethyl hafnium ($C_{20}H_{32}Hf$), bis(methyl-η5-cyclopentadienyl) methoxymethyl hafnium ($HfCH_3(OCH_3)[C_5H_4(CH_3)]_2$), bis(trimethylsilyl) amido hafnium chloride ($[[(CH_3)_3Si]_2N]_2HfCl_2$), dimethylbis(cyclopentadienyl) hafnium (($C_5H_5)_2Hf(CH_3)_2$), hafnium isopropoxide isopropanol adduct ($C_{12}H_{28}HfO_4$), tetrakis(diethylamido) hafnium ($[(CH_2CH_3)_2N]_4Hf$)— also known as TEMAH, tetrakis(ethylmethylamido) hafnium ($[(CH_3)(C_2H_5)N]_4Hf$), tetrakis(dimethylamido) hafnium ($[(CH_3)_2N]_4Hf$)— also known as TDMAH, and hafnium tert-butoxide (HTB). Some hafnium containing precursors can be represented with a formula (RR'N) 4Hf, where R and R' are independent hydrogen or alkyl groups and may be the same or different.

Examples of tungsten containing precursors include bis (butylcyclopentadienyl) tungsten diiodide ($C_{18}H_{26}I_2W$), bis (tert-butylimino)bis(tert-butylamino) tungsten (($C_4H_9NH)_2W(C_4H_9N)2$), bis(tert-butylimino)bis(dimethylamino) tungsten ((($CH_3)_3CN)2W(N(CH_3)_2)2$), bis(cyclopentadienyl) tungstendichloride ($C_{10}H_{10}Cl_2W$), bis(cyclopentadienyl) tungsten dihydride ($C_{10}H_{12}W$), bis(isopropylcyclopentadienyl) tungsten dihydride (($C_5H_4CH(CH_3)_2)_2WH_2$), cyclopentadienyl tungsten tricarbonyl hydride ($C_8H_6O_3W$), tetracarbonyl(1,5-cyclooctadiene)tungsten ($C_{12}H_{12}O_4W$), triamminetungsten tricarbonyl(($NH_3)_3W(CO)_3$), tungsten hexacarbonyl($W(CO)_6$).

Examples of oxygen containing reactive gases that may be also referred to as oxidizing agents may include water ($H_2O$), peroxides (organic and inorganic, including hydrogen peroxide $H_2O_2$), oxygen ($O_2$), ozone ($O_3$), oxides of nitrogen (NO, $N_2O$, $NO_2$, $N_2O_5$), alcohols (e.g., ROH, where R is a methyl, ethyl, propyl, isopropyl, butyl, secondary butyl, or tertiary butyl group, or other suitable alkyl group), carboxylic acids (RCOOH, where R is any suitable alkyl group as above), and radical oxygen compounds (e.g., O, $O_2$, $O_3$, and OH radicals produced by heat, hot-wires, and/or plasma).

Some examples of nitrogen containing reactive gases, which may be also referred to as reagents include ammonia ($NH_3$), alkyl amides, alkyl amines (e.g., tert-butylamine and allylamine), hydrazine ($N_2H_4$), and triazine ($N_3H_5$).

Operations 308 and 310 may be performed without removing the substrate from the chamber and without breaking vacuum in the chamber in order to prevent uncontrolled oxidation of the interface between the resistive switching layer and embedded resistor. As such, the surface of a component, which is formed first, is not exposed to an ambient environment. In fact, operations 308 and 310 may proceed as one continuous operation with only some variations in process conditions, such as using different precursors.

In some embodiments, both operations 308 and 310 involve physical vapor deposition. In these embodiments, a deposition chamber having two targets, e.g., a silicon containing target and a metal containing target may be used. Sputtering of each target may be controlled independently. As such, one target may be sputtered without sputtering the other target. Nitrogen containing and oxygen containing reactive gases may be independently supplied into the deposition chamber for reactive sputtering. Operation 308 may involve sputtering the silicon containing target in an environment containing the oxygen containing reactive gas. At some point 11 during this sputtering, the supply of the oxygen containing reactive gas into the chamber may be discontinued and the nitrogen containing reactive gas may be flown into the chamber. Operation 310 may involve with sputtering the silicon containing target in an environment containing the nitrogen containing reactive gas. At some point, sputtering is switched to the metal containing target. Alternatively, post-deposition oxidation and/or nitridation cycles may be used instead of reactive sputtering.

In some embodiments, method 300 involves annealing 312. Specifically, at least the embedded resistor may be annealed to uniformly distribute the metal, silicon, and nitrogen in this component. In some embodiments, the resistive switching layer, if one is present when annealing 312 is performed, may be annealed together with the embedded resistor to uniformly distribute silicon, oxygen, and nitrogen in this layer. In some embodiments, silicon, oxygen, and nitrogen form silicon oxynitride in the resistive switching layer. The annealing may be performed at a temperature of between about 400° C. and 750° C. for between about 30 seconds and 5 minutes. In some embodiments, one of the resistive switching layer and embedded resistor is annealed separately and then additional annealing is performed on both layers at the same time. In some embodiments, a single anneal operation is preferred. In general, a resistive switching layer benefits more from additional annealing since annealing helps with crystalizing materials forming this layer and, as a result, helps with reducing the defect density thereby achieving lower power operating conditions.

Examples of ReRAM Cells

Figure 4A:
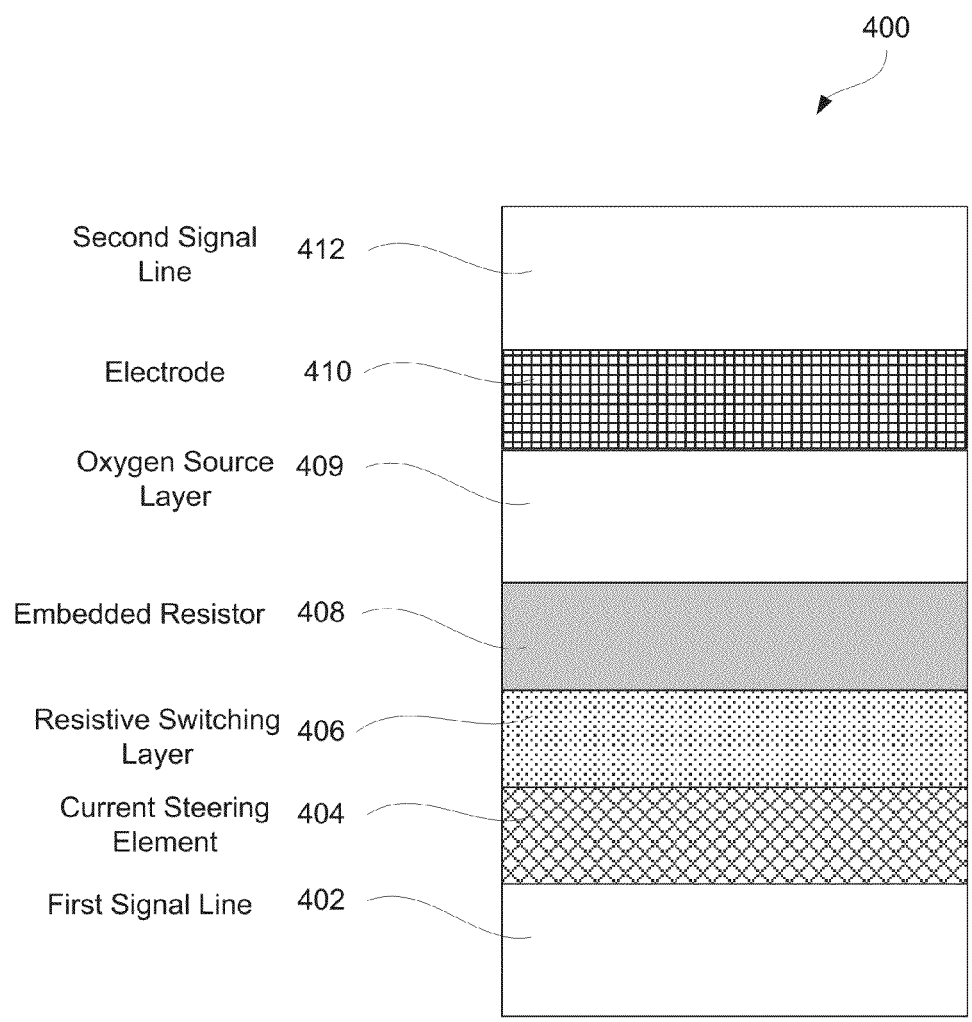
FIG. 4A illustrates a schematic representation of a ReRAM cell including an embedded resistor, resistive switching layer, and other components, in accordance with some embodiments.

FIG. 4A illustrates a schematic representation of a ReRAM cell 400, in accordance with some embodiments. ReRAM cell 400 may include a first signal line 402, a current steering element 404, a resistive switching layer 406, an embedded resistor 408, an oxygen source layer 409, an intermediate electrode 410, and a second signal line 412. Similar to operations described above, the "first" and "second" terms are used herein only for differentiating reasons. These terms do not imply any deposition order or spatial orientation of the layers unless specifically noted. In some embodiments, ReRAM cell 400 has more or fewer layers. For example, an intermediate layer may be disposed between electrode 410 and oxygen source layer 409 in order to improve electrical connection between electrode 410 and embedded resistor 408. Furthermore, an additional electrode may be disposed between first signal line 402 and current steering element 404, if one is present, or between first signal line 402 and resistive switching layer 406, if current steering element 404 is not present. In some embodiments, an additional electrode may be disposed between resistive switching layer 406 and current steering element 404. Furthermore, current steering element 404 and/or intermediate electrode 410 may be omitted from ReRAM cell 400. Also, first signal line 402 and/or second signal line 412 may be operable as electrodes.

First signal line 402 and second signal line 412 provide electrical connections to ReRAM cell 400. For example, first signal line 402 and/or second signal line 412 extend between multiple ReRAM cells, which may be cells provided in the same row or the same column of a memory array as further described below with reference to FIGS. 5A and 5B. First signal line 402 and second signal line 412 may be made from conductive materials, such as n-doped polysilicon, p-doped polysilicon, titanium nitride, ruthenium, iridium, platinum, and tantalum nitride. The signal lines may have a thickness of less than about 100 nanometers (nm), such as less than about 50 nm and even less than about 10 nm. Thinner signal lines may be formed using atomic layer deposition (ALD) techniques. Intermediate electrode 410 and/or additional electrode may be also made from n-doped polysilicon, p-doped polysilicon, titanium nitride, ruthenium, iridium, platinum, and tantalum nitride. In some embodiments, an electrode interfacing with oxygen source layer 409 includes titanium nitride, while another electrode interfacing resistive switching layer 406 includes tungsten.

Current steering element 404, if one is present, may be an intervening electrical component, such as a p-n junction diode, p-i-n diode, transistor, or other similar device disposed between first signal line 402 and second signal line 412. As such, current steering element 404 is connected in series with resistive switching layer 406. In some embodiments, current steering element 404 may include two or more layers of semiconductor materials, such as two or more doped silicon layers, that are configured to direct the flow of current through the device. Current steering element 404 may be a diode that includes a p-doped silicon layer, an un-doped intrinsic layer, and an n-doped silicon layer. The overall resistance of current steering element 404 may be between about 1 kilo-Ohm and about 100 Mega-Ohm. The overall resistance generally depends on the type of current steering element 404 and direction of the current flow through current steering element 404 (e.g., forward or reversed biased). In some embodiments, current steering element 404 may include one or more nitrides. For example, current steering element 404 may be a layer of titanium nitride.

Resistive switching layer 406 is operable to reversibly switch between two resistive states in response to applying a switching signal to ReRAM cell 400 as described above with reference to FIGS. 1B-C and 2A-2B. Resistive switching layer 406 includes silicon, oxygen, and nitrogen. In some embodiments, silicon of resistive switching layer 406 may be replaced completely or partially with aluminum. In some embodiments, resistive switching layer 406 does not include any other components or, more specifically, a combined concentration of silicon, oxygen, and nitrogen in resistive switching layer 406 is at least about 95% atomic or, more specifically, at least 99% atomic. The average concentration of silicon (or aluminum or a combination of silicon and aluminum) in resistive switching layer 406 may be between about 20% atomic and 40% atomic or, more specifically, about 30% atomic and 35% atomic. The average concentration of nitrogen in resistive switching layer 406 may be between about 10% atomic and 30% atomic or, more specifically, about 15% atomic and 25% atomic. The average concentration of oxygen in resistive switching layer 406 may be between about 35% atomic and 35% atomic or, more specifically, about 45% atomic and 55% atomic. Furthermore, the average concentration of silicon (or aluminum or a combination of silicon and aluminum) in resistive switching layer 406 may be greater than the average concentration of silicon (or aluminum or a combination of silicon and aluminum) in embedded resistor 408 due to conductivity considerations. Specifically, replacing metal with silicon (or aluminum or a combination of silicon and aluminum) in embedded resistor 408 makes embedded resistor 408 more conductive. In some embodiments, the concentration of silicon (or aluminum or a combination of silicon and aluminum) in resistive switching layer 406 may vary throughout the thickness of resistive switching layer 406. For example, the concentration of silicon (or aluminum or a combination of silicon and aluminum) may lower at the side interfacing embedded resistor 408 than at the opposite side in order to have more comparable materials at the interface or, more specifically, more comparable silicon (or aluminum or a combination of silicon and aluminum) concentrations at the interface. In some embodiments, the concentration of silicon (or aluminum or a combination of silicon and aluminum) in resistive switching layer 406 at the side interfacing embedded resistor 408 is the same as in the concentration of silicon (or aluminum or a combination of silicon and aluminum, respectively) in embedded resistor 408, at least at this interface. Resistive switching layer 406 may have a thickness of between about 5 Angstroms and 50 Angstroms or, more specifically, between about 10 Angstroms and 30 Angstroms.

Embedded resistor 408 may include a metal, silicon, and nitrogen. In some embodiments, all or some silicon in embedded resistor 408 may be replaced with aluminum. Some examples of suitable metals include tantalum, titanium, hathium, and tungsten. The average concentration of the metal in embedded resistor 408 may be between about 5% atomic and 20% atomic or, more specifically, about 10% atomic and 15% atomic. The average concentration of silicon (or aluminum or a combination of silicon and aluminum) in embedded resistor 408 may be between about 10% atomic and 40% atomic or, more specifically, about 20% atomic and 30% atomic. The average concentration of nitrogen in embedded resistor 408 may be between about 15% atomic and 35% atomic or, more specifically, about 20% atomic and 30% atomic. In some embodiments, the concentration of silicon (or aluminum or a combination of silicon and aluminum) in embedded resistor 408 may vary throughout its thickness. For example, the concentration of silicon (or aluminum or a combination of silicon and aluminum) may lower at the side interfacing resistive switching layer 406 than at the opposite side in order to have more comparable materials at the interface or, more specifically, more comparable silicon (or aluminum or a combination of silicon and aluminum) concentrations at the interface. In some embodiments, the concentration of silicon (or aluminum or a combination of silicon and aluminum) in embedded resistor 408 at the side interfacing resistive switching layer 406 is the same as in the concentration of silicon (or aluminum or a combination of silicon and aluminum) in resistive switching layer 406, at least at this interface. Embedded resistor 408 may have a thickness of between about 5 Angstroms and 500 Angstroms or, more specifically, between about 20 Angstroms and 100 Angstroms.

Figure 4B:
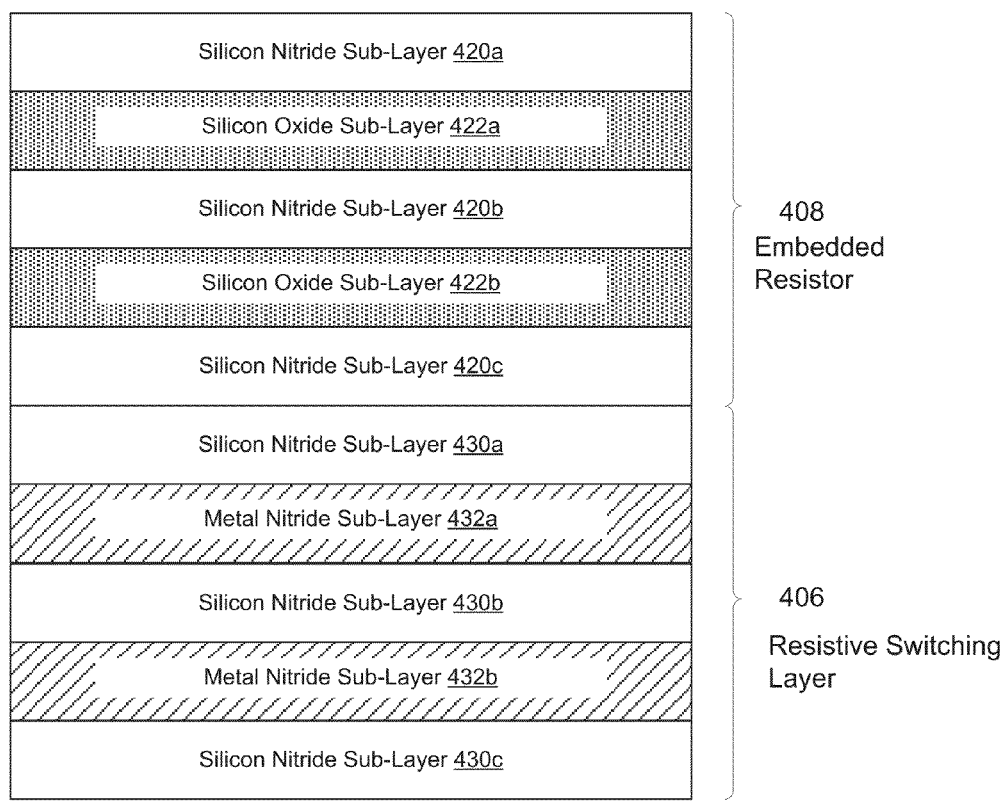
FIG. 4B is a breakdown of an operation used to form a ReRAM cell, in accordance with some embodiments.

Embedded resistor 408 may directly interface resistive switching layer 406. More specifically, embedded resistor 408 may include one or more silicon nitride sub-layers (and/or one or more aluminum nitride sub-layers) and one or more metal nitride sub-layers as, for example, shown in FIG. 4B. One of the silicon nitride sub-layers (and/or one or more aluminum nitride sub-layers) may directly interface embedded resistor 408. FIG. 4B also schematically illustrates embedded resistor 408 having silicon nitride sub-layers 430a, 430b, and 430c as well as metal nitride sub-layers 432a and 432b. Some or all of numeral references 430a, 430b, and 430c may also represent aluminum nitride sub-layers. In some embodiments, having silicon nitride sub-layers 420c of embedded resistor 408 directly interfaces having silicon nitride sub-layers 430a of resistive switching layer 406. Silicon nitride sub-layers 420c and silicon nitride sub-layers 430a may be deposited in consecutive operations as described above. However, silicon nitride sub-layers 420c and silicon nitride sub-layers 430a may have different compositions. For example, the concentration of silicon in silicon nitride sub-layers 420c may be greater than the concentration of silicon in silicon nitride sub-layers 430a.

In some embodiments, silicon nitride sub-layers 420c has a combined concentration of silicon and nitrogen that is at least about 95% atomic or even at least about 99% atomic. In other words, silicon nitride sub-layers 420c of embedded resistor 408 that directly interfaces resistive switching layer 406 includes substantially no component other than silicon and nitrogen. Likewise, silicon nitride sub-layers 430c of resistive switching layer 406 may directly interface an oxygen source layer. In this example, silicon nitride sub-layers 430c may have a combined concentration of silicon and nitrogen that is at least about 95% atomic or even at least about 99% atomic.

Each of silicon nitride sub-layers 430a, 430b, and 430c as well as metal nitride sub-layers 432a and 432b may be formed in a separate deposition operation, such as a separate ALD cycle. Likewise, each of silicon nitride sub-layers 420a, 420b, and 420c as well as silicon oxide sub-layers 422a and 422b may be formed in a separate deposition operation, such as a separate ALD cycle. Distribution of these sub-layers within embedded resistor 408 and/or resistive switching layer 406 may be used to control concentration profiles of various elements within these components.

In one example, a footprint (i.e., cross-sectional area) of embedded resistor 408 may be between about 20 nanometers-square and 100 nanometers-square or, more specifically, between about 30 nanometers-square and 60 nanometers-square, such as about 60 nanometers-square. It will be appreciated that a size or diameter of ReRAM cell 400 and embedded resistor 408 may be determined or configured to achieve a particular target resistance which may be, for example, 100 KOhms. Moreover, a thickness and composition of embedded resistor 408 may also be adjusted for a particular size or diameter to also achieve the target resistance. In this way, a size, thickness, and composition of embedded resistor 408 may each be configured to achieve a particular target resistance which may be determined based on a desired resistance at a particular switching voltage and current.

Memory Array Examples

Figure 5A:
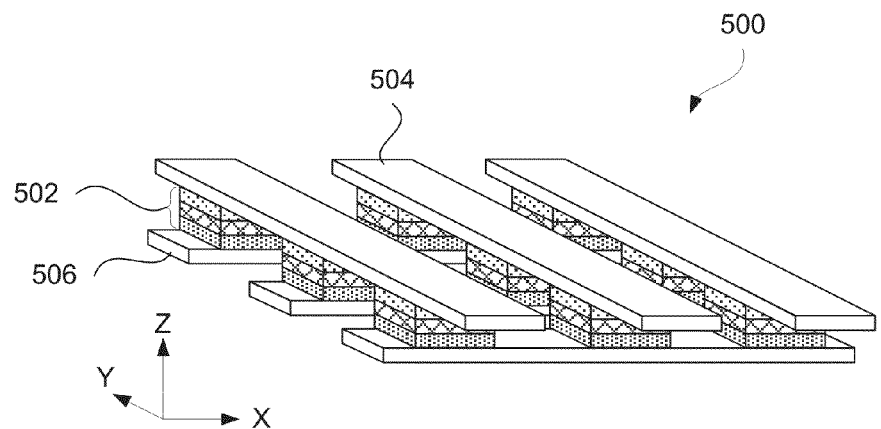
FIGS. 5A and 5B illustrate schematic views of memory arrays including multiple ReRAM cells, in accordance with some embodiments.

A brief description of memory arrays will now be described with reference to FIGS. 5A and 5B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 5A illustrates a memory array 500 including nine ReRAM cells 502, in accordance with some embodiments. In general, any number of ReRAM cells may be arranged into one array. Connections to each ReRAM cell 502 are provided by signal lines 504 and 506, which may be arranged orthogonally to each other. ReRAM cells 502 are positioned at crossings of signal lines 504 and 506 that typically define boundaries of each ReRAM cell in array 500.

Signal lines 504 and 506 are sometimes referred to as word lines and bit lines. These lines are used to read and write data into each ReRAM cell 502 of array 500 by individually connecting ReRAM cells to read and write controllers. Individual ReRAM cells 502 or groups of ReRAM cells 502 can be addressed by using appropriate sets of signal lines 504 and 506. Each ReRAM cell 502 typically includes multiple layers, such as first and second electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 504 and 506.

As stated above, various read and write controllers may be used to control operations of ReRAM cells 502. A suitable controller is connected to ReRAM cells 502 by signal lines 504 and 506 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 500 or each ReRAM cell 502. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 5B:
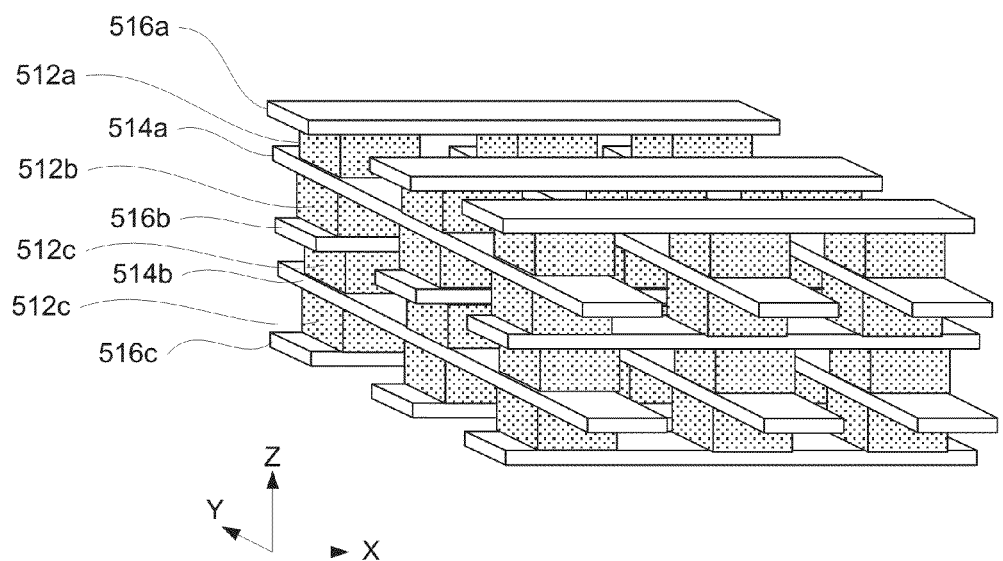

In some embodiments, a memory device may include multiple array layers as, for example, illustrated in FIG. 5B. In this example, five sets of signal lines 514a-b and 516a-c are shared by four ReRAM arrays 512a-c. As with the previous example, each ReRAM array is supported by two sets of signal lines, e.g., array 512a is supported by 514a and 516a. However, middle signal lines 514a-b and 516b, each is shared by two sets ReRAM arrays. For example, signal line set 514*a* provides connections to arrays 512*a* and 512*b*. First and second sets of signal lines 516*a* and 516*c* are only used for making electrical connections to one array. This 3-D arrangement of the memory device should be distinguished from various 3-D arrangements in each individual ReRAM cell.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of fabricating a memory cell, the method comprising:
    forming a first layer over a substrate,
        the first layer operable to reversibly switch between two resistive states in response to applying a switching signal to the memory cell,
        the first layer comprising silicon, oxygen, and nitrogen; and
    forming a second layer directly interfacing the first layer,
        the second layer operable to maintain a constant resistance when the switching signal is applied to the memory cell,
        the second layer comprising a metal, nitrogen, and at least one of silicon or aluminum.

2. The method of claim 1, wherein the first layer and the second layer are formed using atomic layer deposition in a chamber.

3. The method of claim 2, wherein the first layer and the second layer are formed without removing the substrate from the chamber and without breaking vacuum in the chamber.

4. The method of claim 1, wherein forming the second layer comprises forming a silicon nitride sub-layer and forming a metal nitride sub-layer.

5. The method of claim 4, wherein the silicon nitride sub-layer of the second layer directly interfaces the first layer.

6. The method of claim 5, wherein a concentration of silicon in the silicon nitride sub-layer of the second layer is less than a concentration of silicon in the first layer.

7. The method of claim 5, wherein the silicon nitride sub-layer of the second layer directly interfaces a silicon nitride sub-layer of the first layer.

8. The method of claim 7, wherein the silicon nitride sub-layer of the second layer and the silicon nitride sub-layer of the first layer are formed using consecutive atomic layer deposition cycles in a same chamber.

9. The method of claim 8, wherein the silicon nitride sub-layer of the second layer and the silicon nitride sub-layer of the first layer are formed using different process parameters.

10. The method of claim 1, further comprising annealing at least the second layer to uniformly distribute the metal, silicon, and nitrogen in the second layer.

11. The method of claim 1, wherein a thickness of the second layer is between about 20 Angstroms and 100 Angstroms.

12. The method of claim 1, wherein a thickness of the first layer is between about 10 Angstroms and 30 Angstroms.

13. The method of claim 1, wherein the metal of the second layer is one of tantalum, titanium, hafnium, or tungsten.

14. The method of claim 1, wherein forming the first layer comprises:
    flowing a silicon containing precursor into a chamber,
        wherein the silicon containing precursor is adsorbed on a surface of the substrate;
    flowing a nitrogen containing reactive gas into the chamber,
        wherein the nitrogen containing reactive gas reacts with the silicon containing precursor adsorbed on the surface of the substrate; and
    flowing an oxygen containing reactive gas into the chamber,
        wherein the oxygen containing reactive gas reacts with the silicon containing precursor adsorbed on the surface of the substrate.

15. The method of claim 14, wherein the oxygen containing reactive gas is flowed into the chamber after the nitrogen containing reactive gas.

16. The method of claim 1, further comprising forming a third layer operable as an oxygen vacancy source, wherein the third layer comprises an oxide, and wherein the third layer directly interfaces the first layer.

17. The method of claim 16, wherein the oxide of the third layer is hafnium oxide.

18. The method of claim 16, wherein a portion of the first layer interfacing the third layer consists essentially of silicon and nitrogen.

19. The method of claim 1, wherein a concentration of silicon in the second layer is less than the concentration of silicon in the first layer.

20. The method of claim 1, wherein a portion of the second layer interfacing the first layer consists essentially of silicon and nitrogen.

* * * * *